(12) United States Patent
Ou et al.

(10) Patent No.: US 11,196,511 B2
(45) Date of Patent: Dec. 7, 2021

(54) DATA PROCESSING METHOD AND RELATED APPARATUS

(71) Applicant: HUAWEI TECHNOLOGIES CO., LTD., Guangdong (CN)

(72) Inventors: Sisi Ou, Chengdu (CN); Zhangwei Lei, Chengdu (CN); Zhiyu Zhu, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/791,725

(22) Filed: Feb. 14, 2020

(65) Prior Publication Data

US 2020/0186288 A1 Jun. 11, 2020

Related U.S. Application Data

(63) Continuation of application No. PCT/CN2018/098996, filed on Aug. 6, 2018.

(30) Foreign Application Priority Data

Aug. 15, 2017 (CN) .......................... 201710695334.9

(51) Int. Cl.
*H04L 1/00* (2006.01)
*H03M 13/15* (2006.01)
(Continued)

(52) U.S. Cl.
CPC ...... *H04L 1/0071* (2013.01); *H03M 13/1515* (2013.01); *H03M 13/255* (2013.01);
(Continued)

(58) Field of Classification Search
CPC ........... H03M 13/255; H03M 13/1515; H03M 13/2918; H04L 1/0041; H04L 1/0057; H04L 1/0071
See application file for complete search history.

(56) References Cited

U.S. PATENT DOCUMENTS

| 5,465,267 | A | 11/1995 | Todoroki |
| 8,718,087 | B1 * | 5/2014 | Johnston ................. H04L 12/12 370/463 |

(Continued)

FOREIGN PATENT DOCUMENTS

| CN | 1094205 A | 10/1994 |
| CN | 101299649 A | 11/2008 |

(Continued)

OTHER PUBLICATIONS

PCT International Search Report and Written Opinion issued in International Application No. PCT/CN2018/098996 dated Oct. 16, 2018, 16 pages (with English translation).

(Continued)

*Primary Examiner* — Shelly A Chase
(74) *Attorney, Agent, or Firm* — Fish & Richardson P.C.

(57) ABSTRACT

The present disclosure relates to data processing methods and apparatus. One example method includes obtaining a first data block, where the first data block is a data block obtained by dividing first optical path data, adding clock simplified padding data and the first data block into a target information bit in a first data frame to form target data, where the target information bit is an information bit that is preset in the first data frame and that is used to pad optical path data, encoding the target data by using a first error correction encoding scheme to obtain a first code block that has a mapping relationship with the first data frame, where the first error correction encoding scheme matches a frame structure of the first data frame, and sending the first code block.

22 Claims, 10 Drawing Sheets

(51) Int. Cl.
*H03M 13/25* (2006.01)
*H04L 1/08* (2006.01)
(52) U.S. Cl.
CPC .......... *H04L 1/0041* (2013.01); *H04L 1/0057* (2013.01); *H04L 1/08* (2013.01)

(56) References Cited

U.S. PATENT DOCUMENTS

| | | | |
|---|---|---|---|
| 9,397,702 | B2 | 7/2016 | Farhoodfar et al. |
| 2009/0074410 | A1* | 3/2009 | Zou ................. H04J 3/1652 398/52 |
| 2010/0209107 | A1 | 8/2010 | Yin |
| 2012/0207472 | A1 | 8/2012 | Song et al. |
| 2012/0266051 | A1* | 10/2012 | Farhoodfar ....... H03M 13/2918 714/782 |
| 2014/0164883 | A1 | 6/2014 | Xiang |
| 2014/0237325 | A1 | 8/2014 | Farhoodfar et al. |

FOREIGN PATENT DOCUMENTS

| | | |
|---|---|---|
| CN | 101478314 A | 7/2009 |
| CN | 101489157 A | 7/2009 |
| CN | 101662335 A | 3/2010 |
| CN | 101707506 A | 5/2010 |
| CN | 102356585 A | 2/2012 |
| CN | 104734815 A | 6/2015 |
| CN | 103873071 B | 12/2016 |
| EP | 3113502 A1 | 1/2017 |

OTHER PUBLICATIONS

Extended European Search Report issued in European Application No. 18846974.6 dated Jul. 27, 2020, 9 pages.
FiberHome, "FOICk.n framer module interfaces (MFI) in G.Sup58 Ed.2 revision," ITU, Telecommunication Standardization Sector, SG 15-C.0063, Jun. 2017, 6 pages.
Gorshe, "Beyond 100G OTN interface standardization," 2017 Optical Fiber Communications Conference and Exhibition (OFC), OSA, Mar. 2017, 62 pages.
Office Action issued in Chinese Application No. 201710695334.9 dated May 7, 2020, 13 pages (with English translation).

* cited by examiner

DATA PROCESSING METHOD AND RELATED APPARATUS

CROSS-REFERENCE TO RELATED APPLICATIONS

This application is a continuation of International Application No. PCT/CN2018/098996, filed on Aug. 6, 2018, which claims priority to Chinese Patent Application No. 201710695334.9, filed on Aug. 15, 2017. The disclosures of the aforementioned applications are hereby incorporated by reference in their entireties.

TECHNICAL FIELD

This application relates to the optical communications field, and in particular, to a data processing method and a related apparatus.

BACKGROUND

An optical transport network (OTN) is a transport network in an optical layer organization network, is based on a wavelength division multiplexing technology, and is a next-generation backbone transport network. In the OTN network, an OTN interface may implement interconnection between devices or between OTNs. The OTN interface includes two types of interfaces: a user-to-network interface (UNI) and a network node interface (NNI), where the user-to-network interface is an interface between user equipment and a transmission network, the network node interface is an interface between network devices in the transmission network, and the network node interface includes an inter-domain interface (inter-domain interface, IrDI) and an intra-domain interface (intra-domain interface, IaDI).

In some existing design solutions of the IaDI interface, a generic forward error correction (generic forward error correction, GFEC) code and a staircase forward error correction (staircase forward error correction, staircase FEC) code are usually used to reduce a bit error rate of digital signal transmission, improve reliability of transmission, and therefore extend a transmission distance. However, with an increase in a transmission rate of intra-board interconnection, error correction performance of GFEC error correction coding cannot meet a requirement of reliable transmission. In addition, using staircase FEC to perform encoding and decoding in optical transmission causes complex clock synchronization between an intra-board interconnection interface and an optical port, that is, complex clock processing is caused.

SUMMARY

Embodiments of this application provide a data processing method and a related apparatus, so that error correction performance can meet a requirement of reliable transmission, and a clock design is simplified.

According to a first aspect, an embodiment of this application provides a data processing method, including:

obtaining a first data block, where the first data block is a data block obtained by dividing first optical path data; padding clock simplified padding data and the first data block into a target information bit in a first data frame to form target data, where the target information bit is an information bit that is preset in the first data frame and that is used to pad optical path data; encoding the target data by using a first error correction encoding scheme, to obtain a first code block that has a mapping relationship with the first data frame, where the first error correction encoding scheme matches a frame structure of the first data frame; and sending the first code block.

The first optical path data may be an ODU 4, or may be an ODU Cn.

That the error correction encoding scheme or an error correction decoding scheme matches the frame structure of the first data frame means that a ratio of a length of a parity bit in a code block corresponding to the error correction encoding scheme or the error correction decoding scheme to a length of the code block is the same as a ratio of a length of an error correction check overhead in the first data frame to a length of the first data frame.

In this embodiment of this application, the clock simplified padding data is padded into the target information bit. This simplifies a ratio of a length of the first data block to the length of the first data frame, simplifies a clock frequency division ratio between an input end and an output end, and simplifies a clock design of ODSP.

In a possible design, the length of the first data block needs to be determined and the first optical path data needs to be divided. To be specific, before the obtaining a first data block, the method further includes: obtaining the first optical path data; determining a length of the first data block; and dividing the first optical path data into a plurality of data blocks based on the length of the first data block, where the plurality of data blocks include the first data block.

In a possible design, when a length of the clock simplified data is variable and the clock frequency division ratio is fixed, the length of the first data block may be determined based on the preset clock frequency division ratio and the length of the first data frame. The length of the first data frame may be determined by the first error correction encoding scheme, or may be determined by the error correction check overhead used by the first data frame.

In a possible design, when the length of the clock simplified data is variable, the length of the first data block may be determined based on a preset length range of the first data block, the length of the first data frame, a first preset value, and a second preset value, to maximize a common factor of a first target value and a second target value, where the first target value is a product of the length of the first data block and the first preset value, and the second target value is a product of the length of the first data frame and the second preset value.

In a possible design, when the length of the clock simplified padding data is fixed, the length of the clock simplified data may be determined, and then the length of the first data block is determined based on a length of the target information bit in the first data frame and the length of the clock simplified padding data.

In a possible design, the obtaining the first optical path data includes: receiving first interface data; and decoding the first interface data by using Reed-Solomon forward error correction (Reed Solomon Forward Error Correction, RSFEC) decoding, to obtain the first optical path data. The first interface data may be received from a communications interface, where the communications interface may be a flexO interface, and is configured to transmit data of a plurality of rates.

In a possible design, the first error correction encoding scheme may be staircase forward error correction encoding or interleaved cyclic error correction encoding.

According to a second aspect, an embodiment of this application provides another data processing method, including:

receiving a first code block that has a mapping relationship with a first data frame; decoding the first code block by using a first error correction decoding scheme, to obtain target data, where the first error correction decoding scheme matches a frame structure of the first data frame; and removing clock simplified padding data from the target data to obtain a first data block.

In this embodiment of this application, the first data frame is decoded to obtain the target data, and the clock simplified padding data is removed from the target data to obtain the first data block. The clock simplified padding data is designed for simplifying a clock frequency division ratio, so that a length of the first data block and a length of the first data frame have a relatively large common factor, and clock frequency division is relatively simple.

In a possible design, a length of the clock simplified padding data may be determined, and then clock simplified padding data of the same length is removed from the target data based on the length of the clock simplified padding data, to obtain the first data block.

In a possible design, the clock frequency division ratio may be first determined, then the length of the first data block is determined based on the clock frequency division ratio and the length of the first data frame, and the length of the clock simplified padding data is determined based on a length of the target data and the length of the first data block.

In a possible design, the first error correction decoding scheme includes staircase forward error correction decoding or interleaved cyclic forward error correction decoding.

According to a third aspect, an embodiment of this application provides still another data processing method, including:

encapsulating low-rate data into first optical path data; encoding the first optical path data by using Reed-Solomon forward error correction encoding, to obtain first interface data; and sending the first interface data.

The first optical path data may be an ODU 4, or may be an ODU Cn; and the first interface data may be sent by using a communications interface, where the communications interface may be a flexO interface.

In this embodiment of this application, the first optical path data is encoded by using Reed-Solomon forward error correction encoding, so that a requirement of reliable transmission can be met, and error correction performance can be improved.

According to a fourth aspect, an embodiment of this application provides a data processing apparatus. The apparatus has a function of implementing the method according to the first aspect. The function may be implemented by hardware, or implemented by hardware executing corresponding software. The hardware or the software includes one or more units corresponding to the foregoing function.

In a possible design, the apparatus includes a processing unit and a sending unit. The processing unit is configured to obtain a first data block, where the first data block is a data block obtained by dividing first optical path data. The processing unit is further configured to pad clock simplified padding data and the first data block into a target information bit in a first data frame to form target data, where the target information bit is an information bit that is preset in the first data frame and that is used to pad optical path data. The processing unit is further configured to encode the target data by using a first error correction encoding scheme, to obtain a first code block that has a mapping relationship with the first data frame, where the first error correction encoding scheme matches a frame structure of the first data frame. The sending unit is configured to send the first code block.

In a possible design, the apparatus includes a processor, a memory, and a communications interface, where the processor and the memory are separately connected to the communications interface. The memory is configured to store program code, and the processor is configured to invoke the program code to perform the following operations: obtaining a first data block by using the communications interface, where the first data block is a data block obtained by dividing first optical path data; padding clock simplified padding data and the first data block into a target information bit in a first data frame to form target data, where the target information bit is an information bit that is preset in the first data frame and that is used to pad optical path data; encoding the target data by using a first error correction encoding scheme, to obtain a first code block that has a mapping relationship with the first data frame, where the first error correction encoding scheme matches a frame structure of the first data frame; and sending the first code block by using the communications interface.

Based on a same inventive concept, for a problem-resolving principle and beneficial effects of the apparatus, refer to the method according to the first aspect and beneficial effects brought by the method. For implementation of the apparatus, refer to implementation of the method according to the first aspect. No repeated description is provided.

According to a fifth aspect, an embodiment of this application provides another data processing apparatus. The apparatus has a function of implementing the method according to the second aspect. The function may be implemented by hardware, or implemented by hardware executing corresponding software. The hardware or the software includes one or more units corresponding to the foregoing function.

In a possible design, the apparatus includes a receiving unit and a processing unit. The receiving unit is configured to receive a first code block that has a mapping relationship with a first data frame. The processing unit is configured to decode the first code block by using a first error correction decoding scheme, to obtain target data, where the first error correction decoding scheme matches a frame structure of the first data frame. The processing unit is further configured to remove clock simplified padding data from the target data to obtain a first data block.

In a possible design, the apparatus includes a processor, a memory, and a communications interface, where the processor and the memory are separately connected to the communications interface. The memory is configured to store program code, and the processor is configured to invoke the program code to perform the following operations: receiving a first code block that has a mapping relationship with a first data frame by using the communications interface; decoding the first code block by using a first error correction decoding scheme, to obtain target data, where the first error correction decoding scheme matches a frame structure of the first data frame; and removing clock simplified padding data from the target data to obtain a first data block.

Based on a same inventive concept, for a problem-resolving principle and beneficial effects of the apparatus, refer to the method according to the second aspect and beneficial effects brought by the method. For implementation of the apparatus, refer to implementation of the method according to the second aspect. No repeated description is provided.

According to a sixth aspect, an embodiment of this application provides still another data processing apparatus. The apparatus has a function of implementing the method according to the third aspect. The function may be implemented by hardware, or implemented by hardware executing corresponding software. The hardware or the software includes one or more units corresponding to the foregoing function.

In a possible design, the apparatus includes a processing unit and a sending unit. The processing unit is configured to encapsulate low-rate data into first optical path data. The processing unit is further configured to encode the first optical path data by using Reed-Solomon forward error correction encoding, to obtain first interface data. The sending unit is configured to send the first interface data.

In a possible design, the apparatus includes a processor, a memory, and a communications interface, where the processor and the memory are separately connected to the communications interface. The memory is configured to store program code, and the processor is configured to invoke the program code to perform the following operations: encapsulating low-rate data into first optical path data; encoding the first optical path data by using Reed-Solomon forward error correction encoding, to obtain first interface data; and sending the first interface data by using the communications interface.

Based on a same inventive concept, for a problem-resolving principle and beneficial effects of the apparatus, refer to the method according to the third aspect and beneficial effects brought by the method. For implementation of the apparatus, refer to implementation of the method according to the third aspect. No repeated description is provided.

According to a seventh aspect, an embodiment of this application provides a computer storage medium, configured to store a computer program instruction used by a computer, where the computer program instruction includes a program for performing the first aspect.

According to an eighth aspect, an embodiment of this application provides a computer storage medium, configured to store a computer program instruction used by a computer, where the computer program instruction includes a program for performing the second aspect.

According to a ninth aspect, an embodiment of this application provides a computer storage medium, configured to store a computer program instruction used by a computer, where the computer program instruction includes a program for performing the third aspect.

According to the solutions in the embodiments of this application, Reed-Solomon forward error correction coding can meet a transmission requirement of an intra-board interconnection, and improve error correction performance. Before coding, the clock simplified padding data is padded into the target information bit. This simplifies a ratio of the optical path data to a data frame, simplifies the clock frequency division ratio, and simplifies clock designs of an optical data transmit end and an optical data receive end.

DESCRIPTION OF EMBODIMENTS

The following describes the technical solutions in the embodiments of this application with reference to the accompanying drawings in the embodiments of this application.

Figure 1:
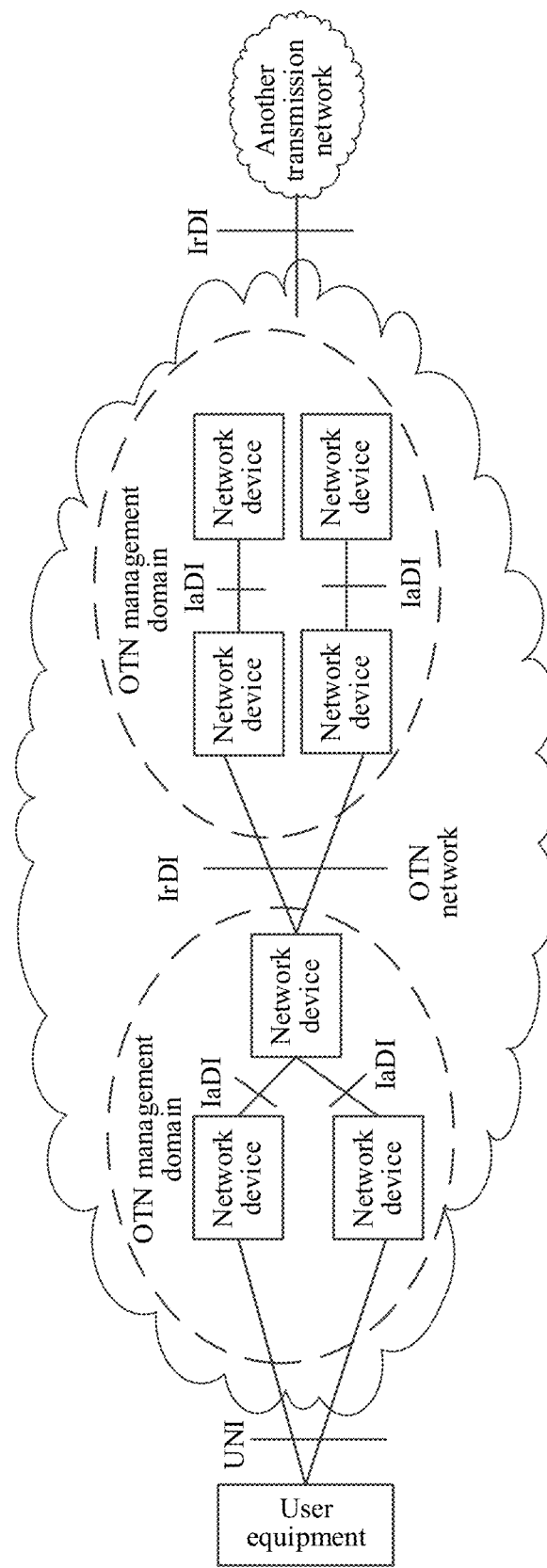
FIG. 1 is a schematic diagram of locations of IaDI interfaces.

The solutions of this application may be implemented on an IaDI interface of an OTN, and a location of the IaDI interface in the OTN network may be shown in FIG. 1. FIG. 1 is a schematic diagram of network interfaces in the OTN according to an embodiment of this application. An interface between user equipment and a transport network is a UNI, an interface between network devices in the transport network is an NNI, the NNI includes an IrDI and an IaDI, the IrDI is an interface between different OTN management domains or an interface between an OTN management domain and another transport network, and the IaDI is an interface between network devices in a same OTN management domain.

Figure 2:
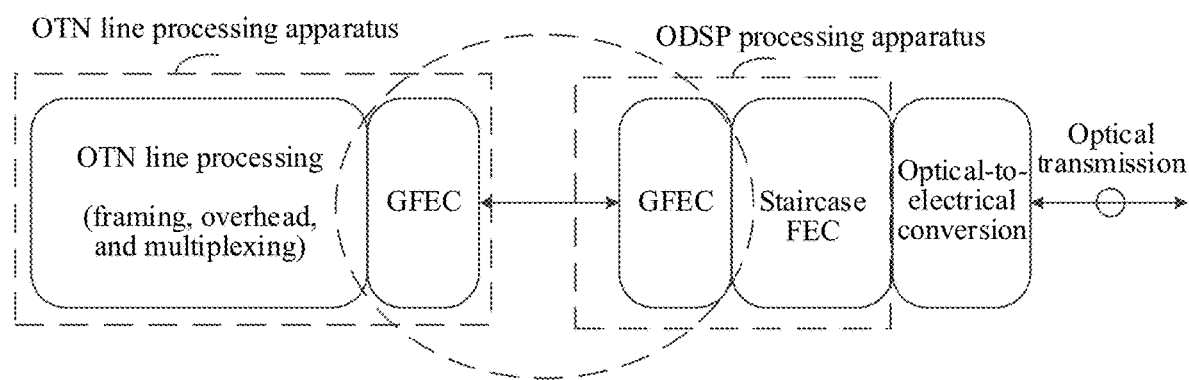
FIG. 2 shows a design solution of an IaDI interface.

In an implementation, an overall design solution of the IaDI interface is shown in FIG. 2. In a transmission solution between an OTN line processing apparatus and an optical digital signal processing (ODSP) apparatus, encoding and decoding are performed by using GFEC, and in an optical transmission solution, encoding and decoding are performed by using staircase FEC.

With an increase in a transmission rate of an intra-board interconnection, a probability of an error in transmission also increases. A better error correction scheme is required to correct an error in a transmission process, but error correction performance of the GFEC cannot meet an error correction requirement. In addition, if a staircase FEC design solution is used, complex ODSP clock processing is caused.

Figure 3:
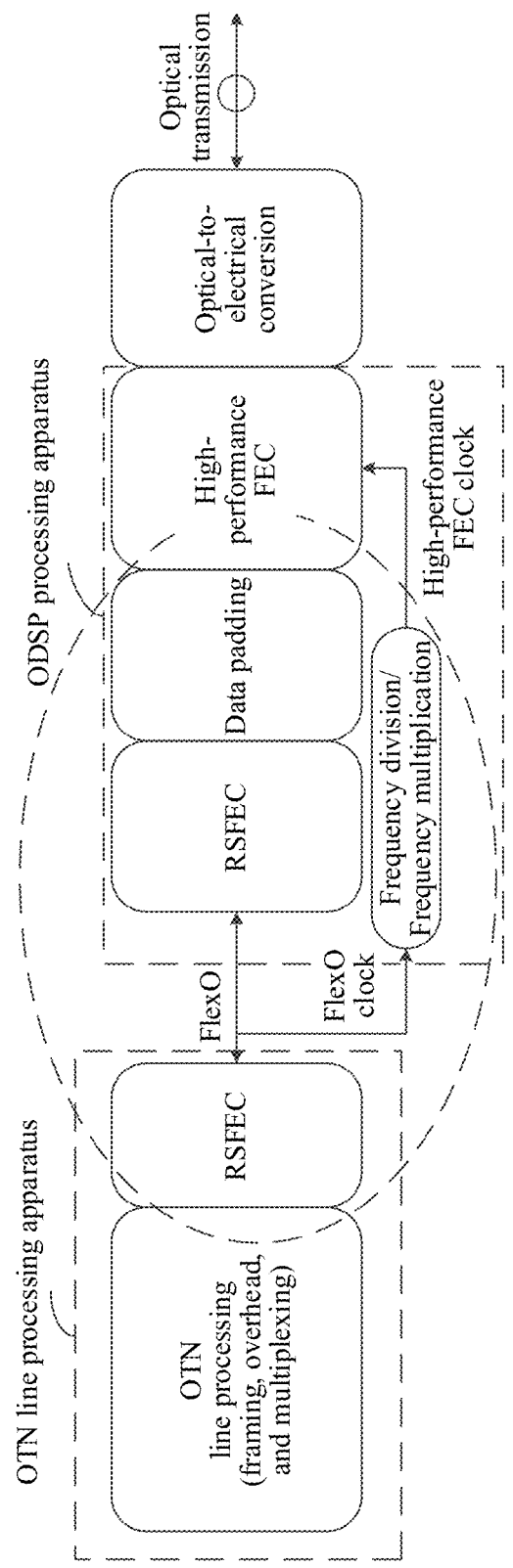
FIG. 3 shows an overall design solution of an IaDI interface according to this application.

In the solution of this application, FEC with higher performance and a high-speed communications interface are used, so that an error correction requirement for high-rate transmission can be met. Before a data frame is formed, clock simplified padding data is padded into a target information bit. This simplifies a ratio of information data in the data frame to a total length of the data frame, and therefore simplifies a clock design. For example, in the transmission solution between the OTN line processing apparatus and the ODSP processing apparatus, error correction may be performed by using RSFEC whose error correction performance is higher than that of the GFEC, and in the optical transmission scheme, error correction is performed by using high-performance FEC coding whose error correction performance is the same as or higher than that of the staircase FEC. In a possible implementation, an overall design solution of this application may be shown in FIG. 3. In the transmission solution between the OTN line processing apparatus and the OPSP processing module, a flexO interface is used as a communications interface, and encoding and decoding are performed by using the RSFEC, and in the optical transmission solution, encoding and decoding are performed by using the high-performance FEC. Before the ODSP processing is performed, data is padded and frequency division/frequency multiplication processing is performed, to synchronize a clock of the flexO interface with a clock of an optical port. In an optional implementation, the high-performance FEC may be the staircase FEC, or may be high-performance FEC such as interleaved cyclic FEC or a low-density parity-check (LDPC) code. The clock simplified padding data is padded into a target information bit in a data frame corresponding to the high-performance FEC, to simplify a frequency division ratio/frequency multiplication ratio, and therefore simplify a clock design. In an optional design solution, the RSFEC may be replaced with another error correction coding whose error correction performance is higher than that of the GFEC.

The foregoing describes an example overall design solution of the embodiments of this application, and the following describes a method in the embodiments of this application.

Figure 4:
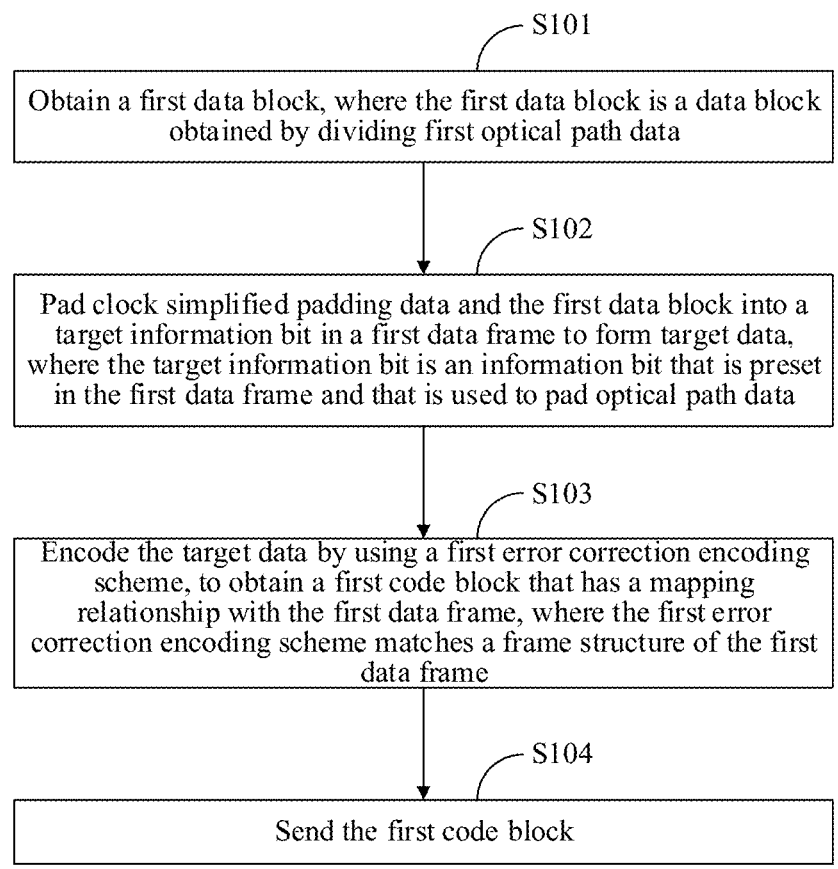
FIG. 4 is a schematic flowchart of a data processing method according to an embodiment of this application.

FIG. 4 is a schematic flowchart of a data processing method according to an embodiment of this application. The method may be implemented on the ODSP processing apparatus shown in FIG. 3 or an apparatus having a function of the ODSP processing apparatus. The method includes the following steps.

S101. Obtain a first data block, where the first data block is a data block obtained by dividing first optical path data.

The first data block is obtained by dividing the first optical path data. Before the first data block is obtained, the first optical path data may be obtained. The first optical path data may be an ODU 4, an ODU Cn, or another high-rate optical path data.

In an optional implementation, the first optical path data may be obtained from the OTN line processing apparatus or the apparatus having the function of the OTN line processing apparatus through a communications interface. It may be learned from the overall design solution in FIG. 2 or FIG. 3 that, an OPSP processing module needs to decode data received from the OTN line processing apparatus to obtain the first optical path data. When error correction is performed in a transmission solution between the OTN line processing apparatus and the ODSP processing apparatus by using the RSFEC shown in FIG. 3, the obtaining the first optical path data may include: receiving first interface data; and decoding the first interface data by using RSFEC decoding, to obtain the first optical path data.

In specific implementation, the first interface data is received from a communications interface, and the communications interface is an intra-board interconnection interface. In an optional implementation, the intra-board interconnection interface may be the flexO interface shown in FIG. 3, or may be a communications interface, for example, flexE, that supports high-rate transmission.

Figure 5:
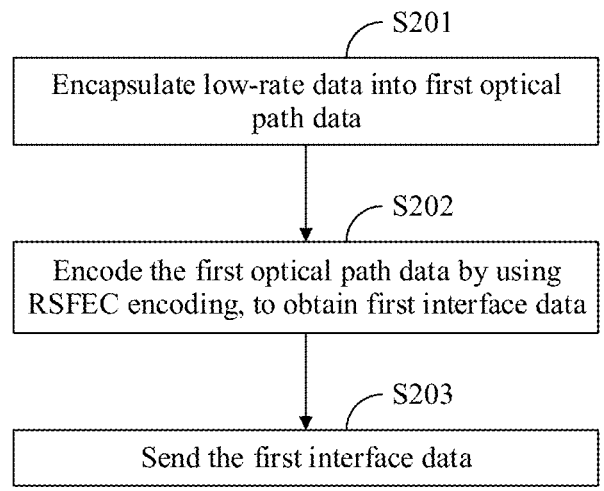
FIG. 5 is a schematic flowchart of another data processing method according to an embodiment of this application.

Correspondingly, the OTN line processing apparatus or the apparatus that has the function of the OTN line processing apparatus encodes the optical path data. A method performed by the OTN line processing apparatus may be shown in FIG. 5. FIG. 5 is a schematic flowchart of another data processing method according to an embodiment of this application. The method includes the following steps.

S201. Encapsulate low-rate data into the first optical path data.

In specific implementation, the low-rate data may be encapsulated into the first optical path data in a manner of reusing, byte interleaving, or the like, and the low-rate data may be an ODU 1, an ODU 2, SDH service signal data, or the like.

S202. Encode the first optical path data by using RSFEC encoding, to obtain the first interface data.

In specific implementation, the OTN line processing apparatus or the apparatus having the function of the OTN line processing apparatus divides the first optical path data into a plurality of second data blocks based on a length of an information byte in a code block corresponding to RSFEC, where a length of the second data block is equal to the length of the information byte in the code block corresponding to the RSFEC. Then, the OTN line processing apparatus or the apparatus having the function of the OTN line processing apparatus encodes the plurality of second data blocks based on an RSFEC encoding scheme, to obtain error correction check overhead data of each second data block, and inserts an error correction check overhead data of each second data block into each second data block, to obtain a code block corresponding to each second data block, where the code blocks corresponding to the plurality of data blocks form the first interface data.

S203. Send the first interface data.

In specific implementation, the OTN line processing apparatus or the apparatus having the function of the OTN line processing apparatus sequentially outputs a plurality of second code blocks in the first interface data obtained through encoding in step S202.

In specific implementation, the first interface data may be sent through a communications interface, and the communications interface may be an intra-board interconnection interface. In an optional implementation, the intra-board interconnection interface may be the flexO interface shown in FIG. 3, or may be a communications interface, for example, flexE, that supports high-rate transmission.

Correspondingly, a specific implementation process in which the OPSP processing module or the apparatus having the function of the ODSP processing apparatus obtains the first optical path data is as follows:

The ODSP processing apparatus or the apparatus having the function of the ODSP processing apparatus sequentially receives the plurality of second code blocks in the first interface data, then separately decodes the plurality of received second code blocks by using an RSFEC decoding scheme, to obtain the second data blocks, and finally restores the plurality of second data blocks based on a frame header identifier of the first optical path data to obtain the first optical path data.

After the first optical path data is obtained, the first optical path data further needs to be divided into a plurality of data blocks of a same size based on a length of the first data block, where the data block includes the first data block. Therefore, before the first data block is obtained, the method further includes: determining the length of the first data block, and dividing the first optical path data into a plurality of data blocks based on the length of the first data block, where the plurality of data blocks include the first data block.

In a first possible implementation scenario, when a length of clock simplified padding data is variable, a clock frequency division ratio may be set, that is, the clock frequency division ratio is fixed and known, and the length of the first data block may be determined based on the preset clock frequency division ratio and a length of the first data frame. The length of the first data frame may be determined based on a frame structure of the first data frame.

In specific implementation, a formula: (first optical path data rate/first communications interface rate)/(first optical path data rate/optical port rate)=clock frequency division ratio may be obtained according to a formula: optical port rate/first communications interface rate=clock frequency division ratio and a formula: (first optical path data rate/first communications interface rate)/(first optical path data rate/optical port rate)=optical port rate/first communications interface rate, where first optical path data rate/first communications interface rate is equal to a ratio of a length of an information byte to a length of a code block in an error correction coding scheme used on the first communications interface, and first optical path data rate/optical port rate is equal to length of the first data block/length of the first data frame. Further, a formula: (second preset value/first preset value)/(length of the first data block/length of the first data frame)=clock frequency division ratio may be obtained. It can be derived from the formula that length of the first data block=(target ratio/clock frequency division ratio)×length of the first data frame, where the target ratio is a ratio of the second preset value to the first preset value, the first communications interface is a communications interface between the OTN line processing apparatus and the ODSP, the first communications interface rate is equal to a rate for transmitting the first interface data, the first preset value is the length of the code block in the error correction coding scheme used on the first communications interface, and the second preset value is the length of the information byte in the encoding scheme used on the first communications interface. After the first preset value and the second preset value are determined based on the error correction coding scheme used on the first communications interface, the length of the first data frame is determined based on the frame structure of the first data frame, and the clock frequency division ratio is determined, the length of the first data block may be determined. For example, if the error correction coding scheme used on the first communications interface is the RSFEC shown in FIG. 3, it is determined that the first preset value is 544 and the second preset value is 514.

In a second possible implementation scenario, when the length of the clock simplified padding data is variable and the clock frequency division ratio is not fixed and unknown, the length of the first data block may be determined based on a preset length range of the first data block, the length of the first data frame, the first preset value, and the second preset value, to maximize a common factor of a first target value and a second target value, where the first target value is a product of the length of the first data block and the first preset value, and the second target value is a product of the length of the first data frame and the second preset value. The first preset value is the length of the code block in the error correction coding scheme used on the first communications interface, and the second preset value is a length of an information byte in an error correction coding scheme used on the first communications interface.

In specific implementation, based on a formula derived from the first possible scenario: (second preset value/first preset value)/(length of the first data block/length of the first data frame)=clock frequency division ratio, (second preset value×length of the first data frame)/(first preset value×length of the first data block)=clock frequency division ratio may be obtained. When the clock frequency division ratio is unknown, the length of the first data block may be determined based on the second preset value, the first preset value, and the length of the first data frame, where the length of the first data block falls within the preset length range of the first data block to maximize the common factor of the first target value and the second target value, the length of the first data block is less than a length of a target information bit in the first data frame, the first target value is a product of the first preset value and the length of the first data block, and the second target value is a product of the second preset value and the length of the first data frame.

In a third possible implementation scenario, when the length of the clock simplified padding data is fixed, the length of the clock simplified padding data may be determined, and the length of the first data block is determined based on the length of the target information bit in the first data frame and the length of the clock simplified padding data.

In specific implementation, the length of the first data block may be determined according to the formula: length of the first data block=length of the target information bit in the first data frame−length of the clock simplified padding data.

Figure 6:
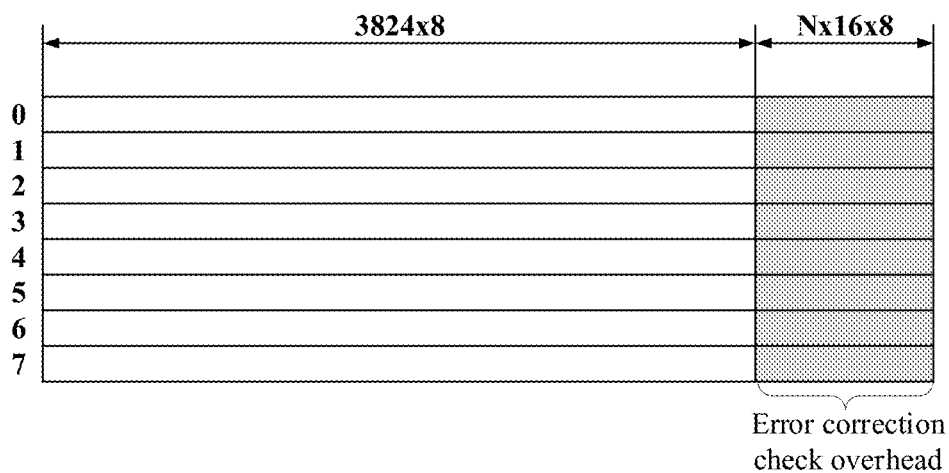
FIG. 6 is a schematic diagram of a frame structure of a first data frame.

The following describes the foregoing three scenarios of determining the length of the first data block by way of examples. It is assumed that an error correction coding scheme corresponding to transmission on the first communications interface is the RSFEC shown in FIG. 3, and an RS (544, 514) code is used in the RSFEC. It is assumed that the frame structure of the first data frame is shown in FIG. 6, the length of the target information bit of the first data frame is 3824×8×8 bits, and the length of the first data frame is (3824+16N)×8×8 bits, where an error correction check overhead of the first data frame varies with a value of N. For example, when N=16, the error correction check overhead of the first data frame is 7%, and when N=31, the error correction check overhead of the first data frame is 13%. The following uses an example in which N=16, that is, the length of the first data frame is 261120 bits for description.

First, it can be learned from the RS (544, 514) code used in transmission on the first communications interface that, length of the information byte/length of the code block=second preset value/first preset value=514/544=257/272.

In a first possible implementation scenario, the clock frequency division ratio is fixed and known. Assuming that the clock frequency division ratio is x, length of the first data block=((257/272)/x)*261120=246720/x can be obtained according to the formula derived from the first possible implementation scenario: length of the first data block=(target ratio/clock frequency division ratio)×length of the first data frame, where target ratio=second preset value/first preset value.

In a second possible implementation scenario, the clock frequency division ratio is not fixed and unknown. It is assumed that the preset length range of the first data block is from 24400 to 244736 bits, second target value/first target value=(257×261120)/(272×length of the first data block)=clock frequency division ratio may be obtained according to the formula: (second preset value×length of the first data frame)/(first preset value×length of the first data block) =clock frequency division ratio derived from the second possible implementation scenario, where the first target value is a product of the length of the first data block and the first preset value, and the second target value is a product of the length of the first data frame and the second preset value. Reduction of a fraction is performed on the first target value and the second target value, to obtain (257×960)/length of the first data block=clock frequency division ratio, where the length of the first data block needs to be greater than 24400 bits and less than 244736 bits (the length of the target information bit in the first data frame). Therefore, when the length of the first data block is 244664 bits, the common factor is the largest, the clock frequency division ratio is 120/119, and the length of the first data block is 244664 bits.

In a third possible implementation scenario, assuming that the length of the clock simplified padding data is 72 bits, length of the first data block=244736−72=244664 bits may be obtained according to the formula in the third possible implementation scenario: length of the first data block=length of the target information bit in the first data frame−length of the clock simplified padding data.

S102. Pad the clock simplified padding data and the first data block into the target information bit in the first data frame to form target data, where the target information bit is an information bit that is preset in the first data frame and that is used to pad optical path data.

In specific implementation, the clock simplified padding data is padded into a preset clock simplified padding information bit in the target information bit, and then the first data block is padded into a remaining information bit in the target information bit.

In an optional implementation, clock simplified padding information bits for padding of the clock simplified padding data in the target information bit may be consecutive. For example, the clock simplified padding information bits may be $N^{th}$ to $(N+M)^{th}$ bits in the target information bit, where N and M are positive integers greater than or equal to 1. The clock simplified padding information bits may alternatively be discrete. For example, the clock simplified padding data is $n^{th}$, $(n+m)^{th}$, $(n+2m)^{th}$, ..., and $(n+km)^{th}$ bits of the information bit, where n, m, and k are all positive integers greater than or equal to 1.

In an optional implementation, when the length of the clock simplified padding data is fixed, a length of the clock simplified padding information bit may be fixed, and the length of the clock simplified padding information bit is equal to the length of the clock simplified padding data. In an optional implementation, when the length of the clock simplified padding data is not fixed, clock simplified padding information bits with a sufficient length may be reserved in the target information bit for padding of the clock simplified padding data with a variable length. In this implementation, if the length of the clock simplified data is less than the length of the clock simplified padding information bit, after the clock simplified padding data is padded into the clock simplified padding data, a remaining clock simplified padding information bit may be used to pad data in the first data block.

In an optional implementation, when the length of the clock simplified padding data is variable, the length of the clock simplified data may be determined based on the length of the first data block, where the length of the clock simplified padding data is equal to a difference between the length of the target information bit in the first data frame and the length of the first data block.

S103. Encode the target data by using a first error correction encoding scheme, to obtain a first code block that has a mapping relationship with the first data frame, where the first error correction encoding scheme matches the frame structure of the first data frame.

In an optional implementation, the first error correction encoding scheme may be staircase forward error correction encoding or interleaved cyclic error correction encoding.

In specific implementation, the target data may be encoded in a manner that corresponds to the first error correction encoding and that is of constructing a code block, to obtain the first code block.

Figure 7A:
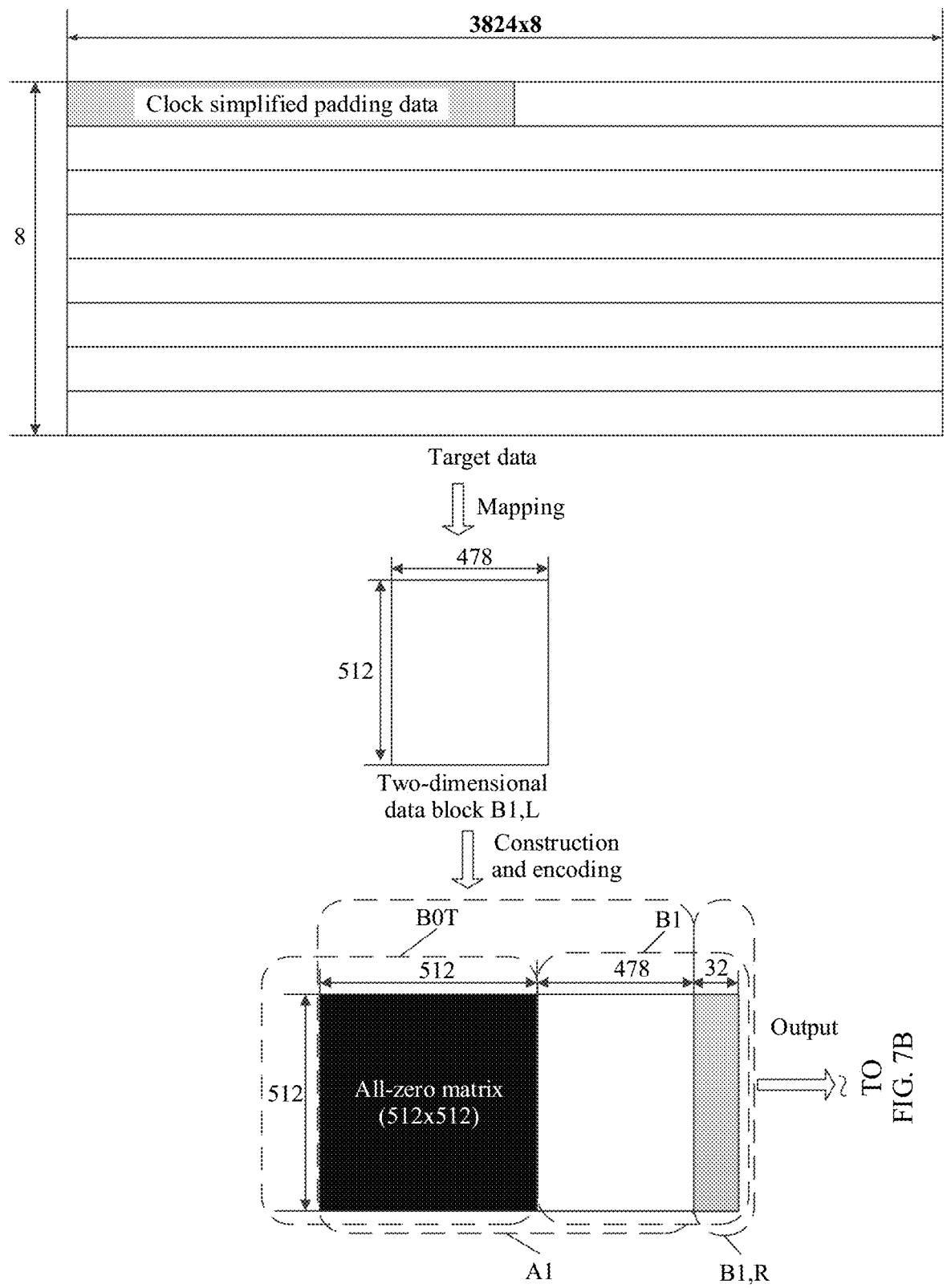
FIG. 7A and FIG. 7B are a schematic flowchart of encoding target data.
Figure 7B:
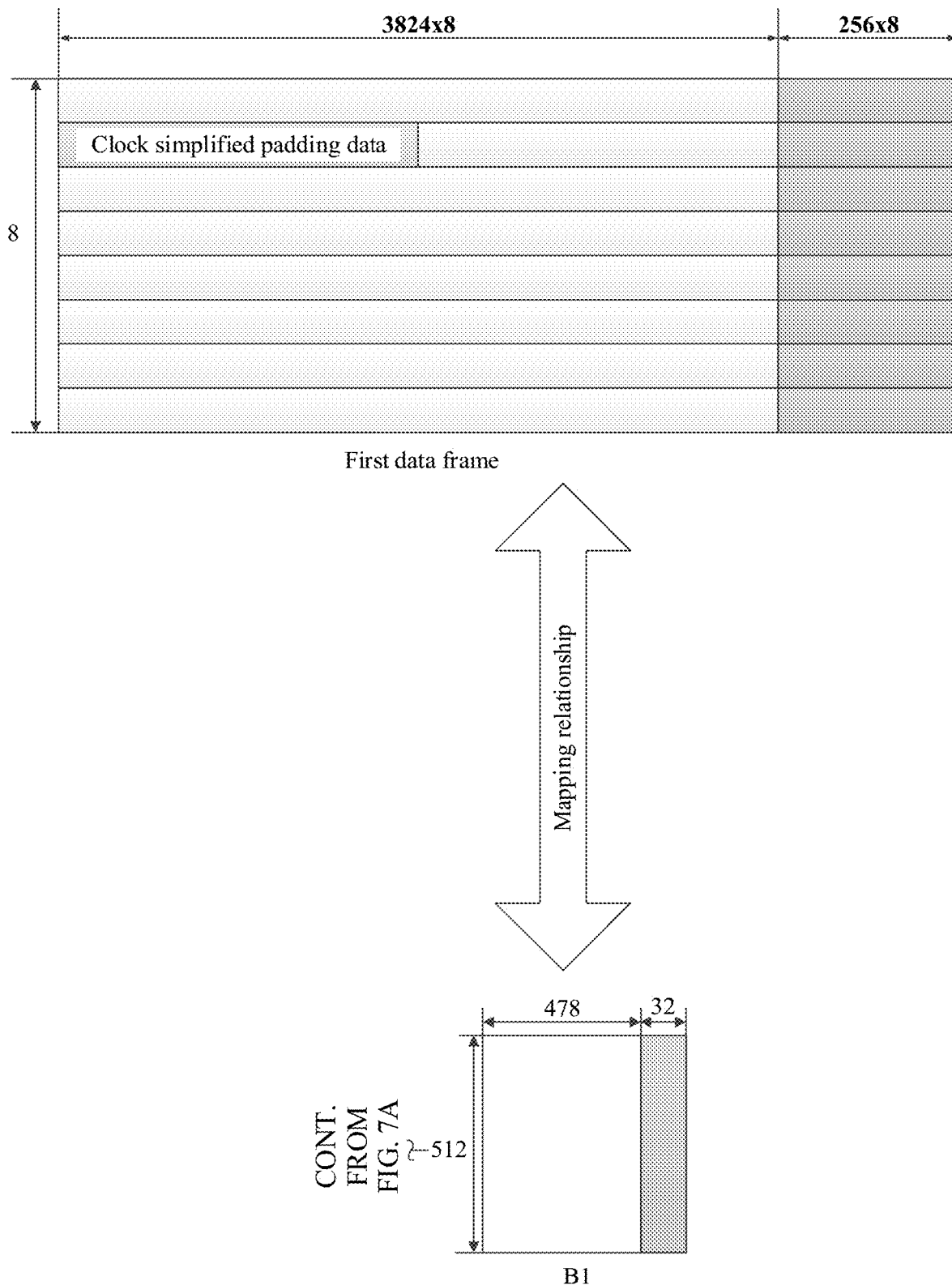

For example, the first error correction encoding scheme is the staircase FEC, the frame structure of the first data frame is shown in FIG. 6, and the error correction check overhead of the first data frame is 7%. In this case, the manner of constructing the first code block is shown in FIG. 7A and FIG. 7B.

First, the target data including the clock simplified padding data and the first data block is mapped to a two-dimensional data block B1,L of a size of 512×478 in a preset mapping mode, where the two-dimensional data block B1,L has 512 rows and 478 columns. A two-dimensional data block A1 of a size 512×990 is then constructed, where A1 is constituted by a two-dimensional data block BOT and a two-dimensional data block B1,L that are both 0; and then each row of the two-dimensional data block A1 is encoded by using the staircase FEC encoding scheme, to obtain a two-dimensional data block that is of a size of 512×32 and that is constituted by parity bits, and output a data block B1 of a size of 512×510, where B1 includes the two-dimensional data block B1,L and a two-dimensional data block B1,R, the two-dimensional data block B1 has a mapping relationship with the first data frame, and the first data frame may be obtained by mapping the two-dimensional data block B1.

S104. Send the first code block.

In specific implementation, the first code block is sent through the optical port. In an optional implementation, before the first code block frame is sent through the optical port, electrical-to-optical conversion processing may further be performed on the first code block.

Figure 8:
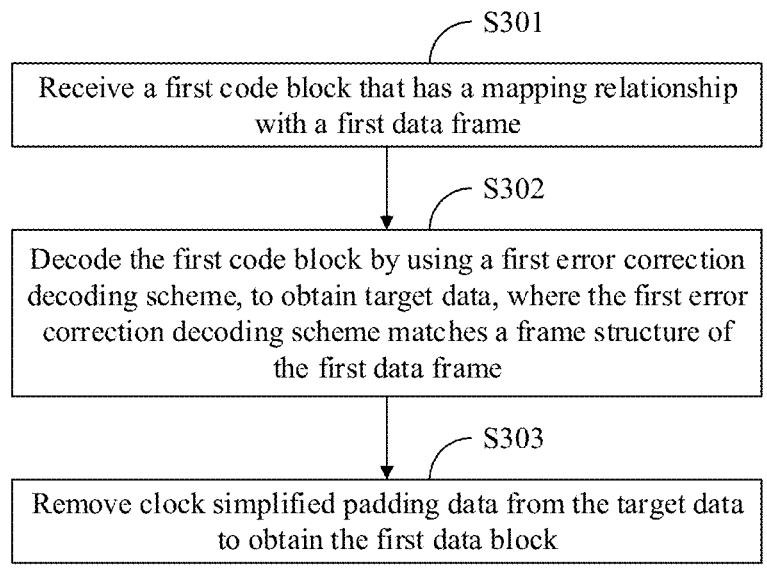
FIG. 8 is a schematic flowchart of still another data processing method according to an embodiment of this application.

Correspondingly, after the first code block is transmitted to a receive end device, the receive end device of the first code block decodes the first code block by using a first error correction decoding scheme corresponding to the first error correction encoding scheme, to obtain the target data, and removes the clock simplified padding data from the target data to obtain the first data block. The receive end device of the first code block may be, for example, the network device connected to the IaDI interface in FIG. 1. A method performed by the network device may be shown in FIG. 8. FIG. 8 is a schematic flowchart of still another data processing method according to an embodiment of this application. The method includes the following steps.

S301. Receive a first code block that has a mapping relationship with a first data frame.

In specific implementation, the network device receives the first code block that has a mapping relationship with the first data frame from an optical port.

S302. Decode the first code block by using the first error correction decoding scheme, to obtain target data, where the first error correction decoding scheme matches a frame structure of the first data frame.

It should be understood that the first error correction decoding scheme used when the receive end device of the first data frame decodes the first data frame corresponds to the first error correction encoding scheme used by a sending device (for example, an ODSP processing apparatus) of the first data frame. For example, the first error correction encoding scheme is the staircase FEC, and correspondingly, the first error correction decoding scheme is the staircase FEC.

In specific implementation, the first code block is decoded by using a decoding operation corresponding to the first error correction decoding scheme, to obtain the target data.

For example, if the first error correction decoding scheme is the staircase FEC, a decoding scheme is: first a received two-dimensional data block B1 is stored into a sliding window; then a matrix A1 is constructed in a manner the same as an encoding scheme, each row of the matrix A1 is decoded, and iteration is performed repeatedly until no error occurs or a quantity of iterations reaches an upper limit; B1 is output, and an error correction check overhead is removed to obtain the target data. For a specific implementation process, refer to a decoding process of the staircase FEC. Details are not described herein again.

S303. Remove the clock simplified padding data from the target data to obtain a first data block.

In an optional implementation, the network device needs to first determine a length and a location of the clock simplified padding data, and then removes, based on the length and the location of the clock simplified padding data, clock simplified padding data of a corresponding location and a corresponding length. In other words, the removing the clock simplified padding data from the target data to obtain the first data block includes: determining the length of the clock simplified padding data, and removing the clock simplified padding data from the target data based on the length of the clock simplified padding data to obtain the first data block.

In the foregoing third possible implementation scenario, if the length of the clock simplified padding data is fixed, clock simplified data of a preset length may be removed from a location in which the clock simplified data is located in a target information bit, to obtain the first data block.

In the foregoing first and second possible implementation scenarios, when the length of the clock simplified padding data is variable, the length of the clock simplified padding data may be determined based on a clock frequency division ratio. In other words, the determining the length of the clock simplified padding data includes: determining the clock frequency division ratio; determining a length of the first data block based on the clock frequency division ratio and a length of the first data frame; and determining the length of the clock simplified padding data based on a length of the target information bit in the first data frame and the length of the first data block.

In a possible implementation, when the clock frequency division ratio is fixed, the length of the first data block may be determined according to a formula: length of the first data block=(target ratio/clock frequency division ratio)×length of the first data frame.

In another possible implementation, the sending device of the first data frame may further send the length of the first data block to a receiving device of the first data frame.

In this embodiment of this application, an FEC with higher performance and a high-speed interface are used, so that an error correction requirement of high-rate transmission can be met. In addition, data is padded, and this simplifies the clock frequency division ratio, and simplifies a clock design.

The foregoing describes in detail the methods in the embodiments of this application. The following provides apparatuses in the embodiments of this application.

Figure 9:
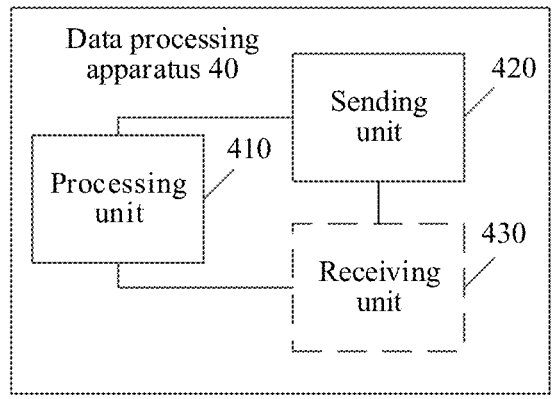
FIG. 9 is a schematic structural diagram of a data processing apparatus according to an embodiment of this application.

FIG. 9 is a schematic structural diagram of a data processing apparatus according to an embodiment of this application. The apparatus 40 is configured to perform the corresponding method steps in FIG. 4. The apparatus may be the OPSP processing module in FIG. 2 or FIG. 3. As shown in the figure, the apparatus may include:

a processing unit 410, configured to obtain a first data block, where the first data block is a data block obtained by dividing first optical path data; where the processing unit 410 is further configured to pad clock simplified padding data and the first data block into a target information bit in a first data frame to form target data, where the target information bit is an information bit that is preset in the first data frame and that is used to pad optical path data; and the processing unit 410 is further configured to encode the target data by using a first error correction encoding scheme, to obtain a first code block that has a mapping relationship with the first data frame, where the first error correction encoding scheme matches a frame structure of the first data frame; and a sending unit 420, configured to send the first code block.

In an optional implementation, the apparatus further includes a receiving unit 430, configured to obtain the first optical path data; where the processing unit 410 is further configured to determine a length of the first data block; and the processing unit 410 is further configured to divide the first optical path data into a plurality of data blocks based on the length of the first data block, where the plurality of data blocks include the first data block.

In an optional implementation, when a length of the clock simplified padding data is variable, the processing unit 410 is specifically configured to: determine the length of the first data block based on a preset clock frequency division ratio and a length of the first data frame.

In an optional implementation, when the length of the clock simplified padding data is variable, the processing unit 410 is specifically configured to: determine the length of the first data block based on a preset length range of the first data block, a length of the first data frame, a first preset value, and a second preset value, to maximize a common factor of a first target value and a second target value, where the first target value is a product of the length of the first data block and the first preset value, and the second target value is a product of the length of the first data frame and the second preset value.

In an optional implementation, when the length of the clock simplified padding data is fixed, the processing unit 410 is specifically configured to: determine the length of the clock simplified padding data; and determine the length of the first data block based on a length of the target information bit in the first data frame and the length of the clock simplified padding data.

In an optional implementation, the receiving unit 430 is further configured to receive first interface data; and the processing unit 410 is specifically configured to: decode the first interface data by using Reed-Solomon forward error correction decoding, to obtain the first optical path data.

In an optional implementation, the first error correction encoding scheme includes: staircase forward error correction encoding or interleaved cyclic error correction encoding.

It should be noted that, for unmentioned content in the embodiment corresponding to FIG. 9 and specific implementation of performing steps by the units, refer to descriptions of the embodiment shown in FIG. 4. Details are not described herein again.

Figure 10:
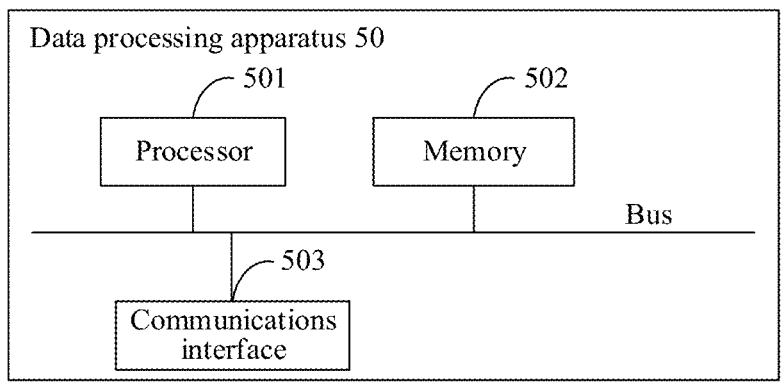
FIG. 10 is a possible schematic structural diagram of another data processing apparatus according to an embodiment of this application.

In a possible implementation, related functions implemented by the processing unit 410, the sending unit 420, and the receiving unit 430 in FIG. 9 may be implemented in a combination of a processor and a communications interface. FIG. 10 is a possible schematic structural diagram of a data processing apparatus according to an embodiment of this application. The apparatus 50 includes a processor 501, a memory 502, and a communications interface 503, where the processor 501, the memory 502, and the communications interface 503 are connected by using one or more communications buses. The processor 501 is configured to support the apparatus in performing a function in the method in FIG. 4. The processor 501 may be a central processing unit (central processing unit, CPU), a network processor (network processor, NP), a hardware chip, or any combination thereof. The foregoing hardware chip may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), generic array logic (generic array logic, GAL), or any combination thereof.

The memory 502 is configured to store program code or the like. The memory 502 may include a volatile memory (volatile memory), for example, a random access memory (random access memory, RAM), or the memory 502 may include a non-volatile memory (non-volatile memory), for example, a read-only memory (read-only memory, ROM), a flash memory (flash memory), a hard disk drive (hard disk drive, HDD), or a solid-state drive (solid-state drive, SSD), or the memory 502 may include a combination of the foregoing types of memories.

The communications interface 503 is configured to receive and send data. For example, the communications interface is configured to send a first code block, receive first interface data, and the like. The communications interface includes an intra-board interconnection interface.

The processor 501 may invoke the program code to perform the following operations:

obtaining a first data block by using the communications interface 403, where the first data block is a data block obtained by dividing first optical path data;

padding clock simplified padding data and the first data block into a target information bit in a first data frame to form target data, where the target information bit is an information bit that is preset in the first data frame and that is used to pad optical path data;

encoding the target data by using a first error correction encoding scheme, to obtain a first code block that has a mapping relationship with the first data frame, where the first error correction encoding scheme matches a frame structure of the first data frame; and sending the first code block by using the communications interface 503.

Further, the processor 501 may further cooperate with the communications interface 503 to perform the operations in the embodiment shown in FIG. 4 of this application. For details, refer to descriptions in the method embodiment, and details are not described herein again.

Figure 11:
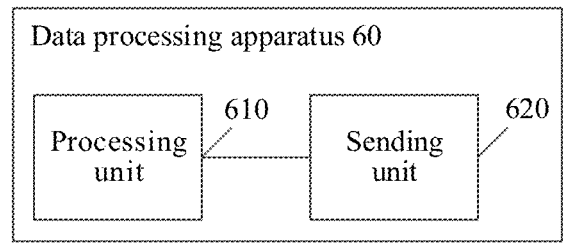
FIG. 11 is a schematic structural diagram of still another data processing apparatus according to an embodiment of this application.

FIG. 11 is a schematic structural diagram of a data processing apparatus according to an embodiment of this application. The apparatus 60 is configured to perform the corresponding method in FIG. 5. The apparatus may be the OTN line processing apparatus in FIG. 2 or FIG. 3. As shown in the figure, the apparatus may include:

a processing unit 610, configured to encapsulate low-rate data into first optical path data; where the processing unit 610 is further configured to encode the first optical path data by using Reed-Solomon forward error correction encoding, to obtain first interface data; and a sending unit 620, configured to send the first interface data.

It should be noted that, for unmentioned content in the embodiment corresponding to FIG. 11 and specific implementation of performing steps by the units, refer to descriptions of the embodiment shown in FIG. 5. Details are not described herein again.

Figure 12:
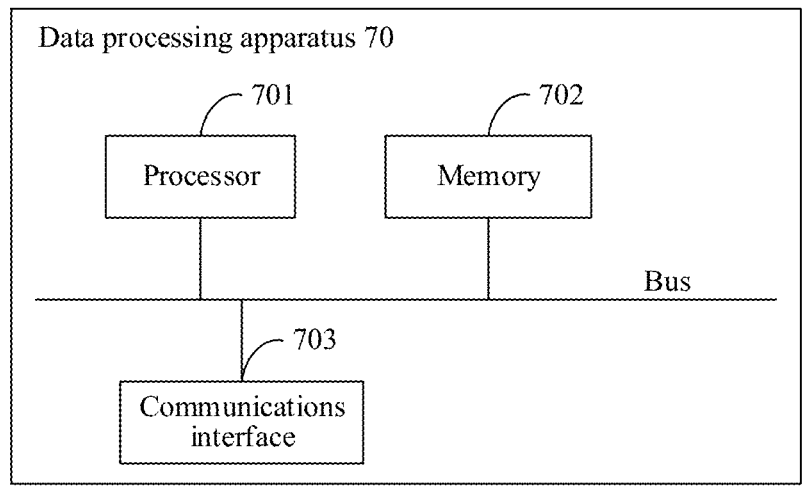
FIG. 12 is a possible schematic structural diagram of yet another data processing apparatus according to an embodiment of this application.

In a possible implementation, related functions implemented by the processing unit 610 and the sending unit 620 in FIG. 11 may be implemented in a combination of a processor and a communications interface. FIG. 12 is a possible schematic structural diagram of a data processing apparatus according to an embodiment of this application. The apparatus 70 includes a processor 701, a memory 702, and a communications interface 703, where the processor 701, the memory 702, and the communications interface 703 are connected by using one or more communications buses. The processor 701 is configured to support the apparatus in performing the function in the method in FIG. 5. The processor 701 may be a central processing unit (central processing unit, CPU), a network processor (network processor, NP), a hardware chip, or any combination thereof. The foregoing hardware chip may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), generic array logic (generic array logic, GAL), or any combination thereof.

The memory 702 is configured to store program code or the like. The memory 702 may include a volatile memory (volatile memory), for example, a random access memory (random access memory, RAM), or the memory 702 may include a non-volatile memory (non-volatile memory), for example, a read-only memory (read-only memory, ROM), a flash memory (flash memory), a hard disk drive (hard disk drive, HDD), or a solid-state drive (solid-state drive, SSD), or the memory 702 may include a combination of the foregoing types of memories.

The communications interface 703 is configured to receive and send data. For example, the communications interface is configured to send first interface data, and the like. The communications interface includes an intra-board interconnection interface.

The processor 701 may invoke the program code to perform the following operations:

encapsulating low-rate data into first optical path data;

encoding the first optical path data by using Reed-Solomon forward error correction encoding, to obtain first interface data; and sending the first interface data by using the communications interface 703.

Further, the processor 701 may further cooperate with the communications interface 703 to perform the operations in the embodiment shown in FIG. 5 of this application. For details, refer to descriptions in the method embodiment, and details are not described herein again.

Figure 13:
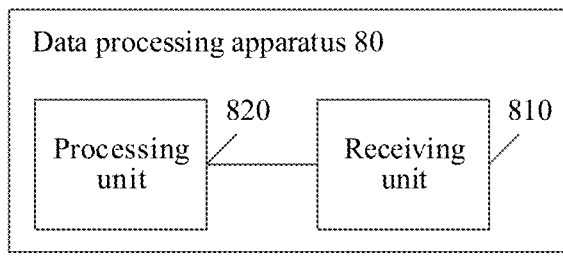
FIG. 13 is a schematic structural diagram of still yet another data processing apparatus according to an embodiment of this application.

FIG. 13 is a schematic structural diagram of a data processing apparatus according to an embodiment of this application. The apparatus 80 is configured to perform the corresponding method in FIG. 8. As shown in the figure, the apparatus includes:

a receiving unit 810, configured to receive a first code block that has a mapping relationship with a first data frame; and a processing unit 820, configured to decode the first code block by using a first error correction decoding scheme, to obtain target data, where the first error correction decoding scheme matches a frame structure of the first data frame; where the processing unit 820 is further configured to remove clock simplified padding data from the target data to obtain a first data block.

In an optional implementation, the processing unit 820 is specifically configured to: determine a length of the clock simplified padding data; and remove the clock simplified padding data from the target data based on the length of the clock simplified padding data, to obtain the first data block.

In an optional implementation, the processing unit 820 is specifically configured to: determine a clock frequency division ratio; determine a length of the first data block based on the clock frequency division ratio and a length of the first data frame; and determine the length of the clock simplified padding data based on a length of a target information bit in the first data frame and the length of the first data block.

In an optional implementation, the first error correction decoding scheme includes: staircase forward error correction decoding or interleaved cyclic forward error correction decoding.

It should be noted that, for unmentioned content in the embodiment corresponding to FIG. 13 and specific implementation of performing steps by the units, refer to descriptions of the embodiment shown in FIG. 8. Details are not described herein again.

Figure 14:
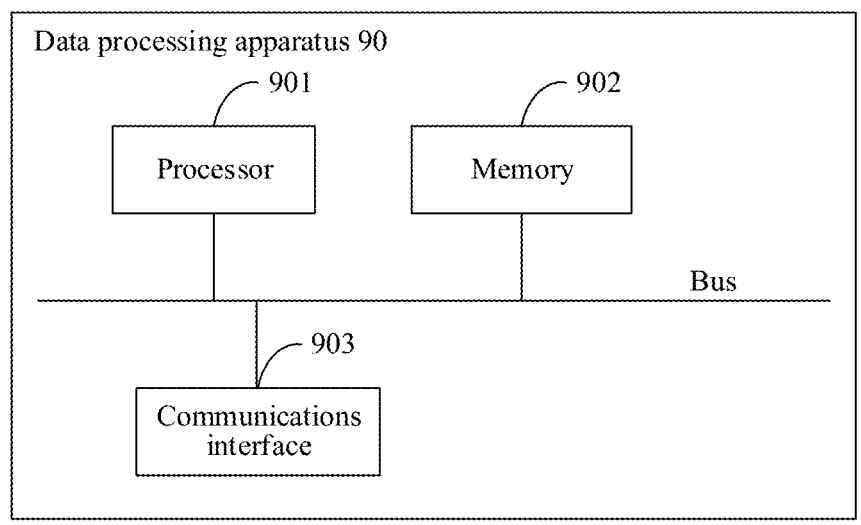
FIG. 14 is a possible schematic structural diagram of a further data processing apparatus according to an embodiment of this application.

In a possible implementation, related functions implemented by the receiving unit 810 and the processing unit 820 in FIG. 13 may be implemented in a combination of a processor and a communications interface. FIG. 14 is a possible schematic structural diagram of a data processing apparatus according to an embodiment of this application. The apparatus 90 includes a processor 901, a memory 902, and a communications interface 903, where the processor 901, the memory 902, and the communications interface 903 are connected by using one or more communications buses. The processor 901 is configured to support the apparatus in performing the function in the method in FIG. 8. The processor 901 may be a central processing unit (central processing unit, CPU), a network processor (network processor, NP), a hardware chip, or any combination thereof. The foregoing hardware chip may be an application-specific integrated circuit (application-specific integrated circuit, ASIC), a programmable logic device (programmable logic device, PLD), or a combination thereof. The PLD may be a complex programmable logic device (complex programmable logic device, CPLD), a field-programmable gate array (field-programmable gate array, FPGA), generic array logic (generic array logic, GAL), or any combination thereof.

The memory 902 is configured to store program code or the like. The memory 902 may include a volatile memory (volatile memory), for example, a random access memory (random access memory, RAM), or the memory 902 may include a non-volatile memory (non-volatile memory), for example, a read-only memory (read-only memory, ROM), a flash memory (flash memory), a hard disk drive (hard disk drive, HDD), or a solid-state drive (solid-state drive, SSD), or the memory 902 may include a combination of the foregoing types of memories.

The communications interface 903 is configured to receive and send data. For example, the communications interface is configured to receive first code block, and the like. The communications interface is an optical port.

The processor 901 may invoke the program code to perform the following operations:

receiving a first code block that has a mapping relationship with a first data frame by using the communications interface 903;

decoding the first code block by using a first error correction decoding scheme, to obtain target data, where the first error correction decoding scheme matches a frame structure of the first data frame; and removing clock simplified padding data from the target data to obtain a first data block.

Further, the processor 901 may further cooperate with the communications interface 903 to perform the operations in the embodiment shown in FIG. 8 of this application. For details, refer to descriptions in the method embodiment, and details are not described herein again.

A person of ordinary skill in the art may be aware that, in combination with the examples described in the embodiments disclosed in this application, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing described system, apparatus, and unit, refer to a corresponding process in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electronic form, a mechanical form, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instructions are loaded and executed on a computer, the procedure or functions according to the embodiments of the present invention are all or partially generated. The computer may be a general-purpose computer, a dedicated computer, a computer network, or another programmable apparatus. The computer instruction may be stored in a computer-readable storage medium, or may be transmitted by using the computer-readable storage medium. The computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a DVD), a semiconductor medium (for example, a solid-state drive SSD)), or the like.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A data processing method, comprising:
   obtaining a first data block, wherein the first data block is a data block obtained by dividing first optical path data;
   adding clock simplified padding data and the first data block into a target information bit in a first data frame to form target data, wherein the target information bit is an information bit that is preset in the first data frame and that is used to pad optical path data;
   encoding the target data by using a first error correction encoding scheme to obtain a first code block that has a mapping relationship with the first data frame, wherein the first error correction encoding scheme matches a frame structure of the first data frame; and
   sending the first code block.

2. The method according to claim 1, wherein before the obtaining a first data block, the method further comprises:
   obtaining the first optical path data;
   determining a length of the first data block; and
   dividing the first optical path data into a plurality of data blocks based on the length of the first data block, wherein the plurality of data blocks comprise the first data block.

3. The method according to claim 2, wherein when a length of the clock simplified padding data is variable, the determining a length of the first data block comprises:
   determining the length of the first data block based on a preset clock frequency division ratio and a length of the first data frame.

4. The method according to claim 2, wherein when a length of the clock simplified padding data is variable, the determining a length of the first data block comprises:
   determining the length of the first data block based on a preset length range of the first data block, a length of the first data frame, a first preset value, and a second preset value to maximize a common factor of a first target value and a second target value, wherein the first target value is a product of the length of the first data block and the first preset value, and wherein the second target value is a product of the length of the first data frame and the second preset value.

5. The method according to claim 2, wherein when a length of the clock simplified padding data is fixed, the determining a length of the first data block comprises:
   determining the length of the clock simplified padding data; and
   determining the length of the first data block based on a length of the target information bit in the first data frame and the length of the clock simplified padding data.

6. The method according to claim 2, wherein the obtaining the first optical path data comprises:
   receiving first interface data; and
   decoding the first interface data by using Reed-Solomon forward error correction decoding to obtain the first optical path data.

7. The method according to claim 1, wherein the first error correction encoding scheme comprises:
   staircase forward error correction encoding or interleaved cyclic error correction encoding.

8. A data processing method, comprising:
   receiving a first code block that has a mapping relationship with a first data frame;
   decoding the first code block by using a first error correction decoding scheme to obtain target data, wherein the first error correction decoding scheme matches a frame structure of the first data frame; and
   removing clock simplified padding data from the target data to obtain a first data block.

9. The method according to claim 8, wherein the removing clock simplified padding data from the target data to obtain a first data block comprises:
   determining a length of the clock simplified padding data; and
   removing the clock simplified padding data from the target data based on the length of the clock simplified padding data to obtain the first data block.

10. The method according to claim 9, wherein the determining a length of the clock simplified padding data comprises:
    determining a clock frequency division ratio;
    determining a length of the first data block based on the clock frequency division ratio and a length of the first data frame; and
    determining the length of the clock simplified padding data based on a length of the target data and the length of the first data block.

11. The method according to claim 8, wherein the first error correction decoding scheme comprises:
    staircase forward error correction decoding or interleaved cyclic forward error correction decoding.

12. A data processing apparatus, comprising:
    at least one processor, the at least one processor configured to:
    obtain a first data block, wherein the first data block is a data block obtained by dividing first optical path data;
    add clock simplified padding data and the first data block into a target information bit in a first data frame to form target data, wherein the target information bit is an information bit that is preset in the first data frame and that is used to pad optical path data; and
encode the target data by using a first error correction encoding scheme to obtain a first code block that has a mapping relationship with the first data frame, wherein the first error correction encoding scheme matches a frame structure of the first data frame; and
a transmitter, the transmitter configured to send the first code block.

13. The apparatus according to claim 12, wherein the apparatus further comprises:
a receiver, the receiver configured to obtain the first optical path data, wherein the at least one processor is further configured to:
determine a length of the first data block; and
divide the first optical path data into a plurality of data blocks based on the length of the first data block, wherein the plurality of data blocks comprise the first data block.

14. The apparatus according to claim 13, wherein when a length of the clock simplified padding data is variable, the at least one processor is configured to:
determine the length of the first data block based on a preset clock frequency division ratio and a length of the first data frame.

15. The apparatus according to claim 13, wherein when a length of the clock simplified padding data is variable, the at least one processor is configured to:
determine the length of the first data block based on a preset length range of the first data block, a length of the first data frame, a first preset value, and a second preset value to maximize a common factor of a first target value and a second target value, wherein the first target value is a product of the length of the first data block and the first preset value, and wherein the second target value is a product of the length of the first data frame and the second preset value.

16. The apparatus according to claim 13, wherein when a length of the clock simplified padding data is fixed, the at least one processor is configured to:
determine the length of the clock simplified padding data; and
determine the length of the first data block based on a length of the target information bit in the first data frame and the length of the clock simplified padding data.

17. The apparatus according to claim 13, wherein:
the receiver is further configured to receive first interface data; and
the at least one processor is configured to:
decode the first interface data by using Reed-Solomon forward error correction decoding to obtain the first optical path data.

18. The apparatus according to claim 12, wherein the first error correction encoding scheme comprises:
staircase forward error correction encoding or interleaved cyclic error correction encoding.

19. A data processing apparatus, comprising:
a receiver, the receiver configured to receive a first code block that has a mapping relationship with a first data frame; and
at least one processor, the at least one processor configured to:
decode the first code block by using a first error correction decoding scheme to obtain target data, wherein the first error correction decoding scheme matches a frame structure of the first data frame; and
remove clock simplified padding data from the target data to obtain a first data block.

20. The apparatus according to claim 19, wherein the at least one processor is configured to:
determine a length of the clock simplified padding data; and
remove the clock simplified padding data from the target data based on the length of the clock simplified padding data to obtain the first data block.

21. The apparatus according to claim 20, wherein the at least one processor is configured to:
determine a clock frequency division ratio;
determine a length of the first data block based on the clock frequency division ratio and a length of the first data frame; and
determine the length of the clock simplified padding data based on a length of the target data and the length of the first data block.

22. The apparatus according to claim 19, wherein the first error correction decoding scheme comprises:
staircase forward error correction decoding or interleaved cyclic forward error correction decoding.

* * * * *